United States Patent
(12) Lee et al.

(10) Patent No.: US 12,745,548 B2
(45) Date of Patent: Sep. 22, 2026

(54) ORGANIC LIGHT-EMITTING DIODE DISPLAY DEVICE

(71) Applicant: LG Display Co., Ltd., Seoul (KR)

(72) Inventors: Min-Jic Lee, Paju-si (KR); Chang-Soo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 684 days.

(21) Appl. No.: 18/051,030

(22) Filed: Oct. 31, 2022

(65) Prior Publication Data

US 2023/0209886 A1 Jun. 29, 2023

(30) Foreign Application Priority Data

Dec. 29, 2021 (KR) ........................ 10-2021-0191622

(51) Int. Cl.
*H01L 51/52* (2006.01)
*H01L 27/32* (2006.01)
*H10K 59/35* (2023.01)
*H10K 59/80* (2023.01)
*H10K 59/12* (2023.01)

(52) U.S. Cl.
CPC ........... *H10K 59/879* (2023.02); *H10K 59/35* (2023.02); *H10K 59/8792* (2023.02); *H10K 59/12* (2023.02)

(58) Field of Classification Search
CPC .. H10K 59/879; H10K 59/35; H10K 59/8792; H10K 59/12; H10K 59/38; H10K 59/00–95; H10K 50/865; H10K 50/858; H10K 50/841; H10K 50/00–88
See application file for complete search history.

(56) References Cited

U.S. PATENT DOCUMENTS

2021/0043697 A1 2/2021 Kim et al.
2021/0241677 A1* 8/2021 Chung ................. H10K 59/353
2021/0399264 A1* 12/2021 Ueda .................... H10K 59/879
2022/0085335 A1* 3/2022 Shimatsu ............... H10K 59/38
2022/0140008 A1* 5/2022 Fukagawa ............ H10K 59/122 257/98

(Continued)

FOREIGN PATENT DOCUMENTS

CN 104425561 A 3/2015
CN 107785393 A 3/2018

(Continued)

OTHER PUBLICATIONS

Zhang translation (Year: 2020).*
Office Action in Chinese Appln. No. 202211349145.3, mailed on Jun. 9 2026, 15 pages (with English translation).

*Primary Examiner* — Steven B Gauthier
*Assistant Examiner* — Rhys Poniente Sheker
(74) *Attorney, Agent, or Firm* — Fish & Richardson P.C.

(57) ABSTRACT

An organic light-emitting diode display device includes a display panel including a first electrode, a light-emitting layer, and a second electrode provided at each sub-pixel; a first black matrix over the display panel; a lens over the first black matrix and corresponding to the sub-pixel; a translucent overcoat layer over the lens; a color filter layer over the translucent overcoat layer; a second black matrix between the first black matrix and the color filter layer; and a cover window over the color filter layer, wherein a width of the first black matrix is larger than a width of the second black matrix in a first direction.

16 Claims, 10 Drawing Sheets

(56) References Cited

U.S. PATENT DOCUMENTS

| | | | | |
|---|---|---|---|---|
| 2023/0116030 | A1* | 4/2023 | Sui | H10K 59/879 257/40 |
| 2024/0179949 | A1* | 5/2024 | Han | H10K 59/80516 |

FOREIGN PATENT DOCUMENTS

| | | | | | |
|---|---|---|---|---|---|
| CN | 110649081 | A | * | 1/2020 | H10F 39/8063 |
| CN | 111108602 | A | | 5/2020 | |
| CN | 111752028 | A | | 10/2020 | |
| CN | 112912948 | A | | 6/2021 | |
| CN | 113206131 | A | | 8/2021 | |
| KR | 20130069306 | A | | 6/2013 | |
| KR | 10-2014-0014684 | A | | 2/2014 | |
| KR | 10-2019-0071119 | A | | 6/2019 | |
| KR | 10-2020-0044288 | A | | 4/2020 | |

* cited by examiner

ORGANIC LIGHT-EMITTING DIODE DISPLAY DEVICE

CROSS-REFERENCE TO RELATED APPLICATION

The present application claims the priority of Korean Patent Application No. 10-2021-0191622 filed on Dec. 29, 2021, which is hereby incorporated by reference in its entirety.

BACKGROUND

Field of the Disclosure

The present disclosure relates to an organic light-emitting diode display device, and more particularly, to an organic light-emitting diode display device with a limited viewing angle.

Description of the Background

As the information society is in progress, a demand for display devices of displaying images increases in various forms, and flat panel display devices (FPD) such as liquid crystal display devices (LCD) and organic light-emitting diode display devices (OLED) have been developed and applied to various fields.

Among the flat panel display devices, organic light-emitting diode display devices, which are also referred to as organic electroluminescent display devices, emit light due to the radiative recombination of an exciton after forming the exciton from an electron and a hole by injecting charges into a light-emitting layer between a cathode for injecting electrons and an anode for injecting holes in a light-emitting diode.

The organic light-emitting diode display device can be formed on a flexible substrate such as plastic. In addition, because it is self-luminous, the organic light-emitting diode display device has an excellent contrast ratio and an ultra-thin thickness, and has a response time of several microseconds, and thus there are advantages in displaying moving images without delays. The organic light-emitting diode display device also has a wide viewing angle and is stable under low temperatures. Since the organic light-emitting diode display device is driven by low voltage of direct current (DC) 5 V to 15 V, it is easy to design and manufacture driving circuits.

Meanwhile, reflection of the external light is high in the organic light-emitting diode display device. The reflection of the external light increases the luminance at black state, which reduces the contrast ratio and degrades image qualities. Thus, in order to prevent the reflection of the external light, a polarizing plate has been applied thereto.

However, since the polarizing plate is manufactured to include a plurality of films, application of the polarizing plate causes an increase in costs. In addition, the polarizing plate can prevent the reflection of the external light, but can also block some of the internal light generated in a display panel, so that the luminance can be decreased.

SUMMARY

Accordingly, the present disclosure is directed to an organic light-emitting diode display device that substantially obviates one or more of the problems due to limitations and disadvantages described above.

More specifically, the present disclosure is to provide an organic light-emitting diode display device capable of improving the luminance.

Additional features and aspects will be set forth in the description that follows, and in part will be apparent from the description, or may be learned by practice of the present disclosure provided herein. Other features and aspects of the inventive concepts may be realized and attained by the structure particularly pointed out in the written description, or derivable therefrom, and the claims hereof as well as the appended drawings.

To achieve these and other aspects of the present disclosure, as embodied and broadly described herein, an organic light-emitting diode display device includes a display panel including a first electrode, a light-emitting layer, and a second electrode provided at each sub-pixel; a first black matrix over the display panel; a lens over the first black matrix and corresponding to the sub-pixel; a translucent overcoat layer over the lens; a color filter layer over the translucent overcoat layer; a second black matrix between the first black matrix and the color filter layer; and a cover window over the color filter layer, wherein a width of the first black matrix is larger than a width of the second black matrix in a first direction.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Reference will now be made in detail to aspects of the disclosure, exemplary aspects of which are illustrated in the accompanying drawings.

Figure 1:
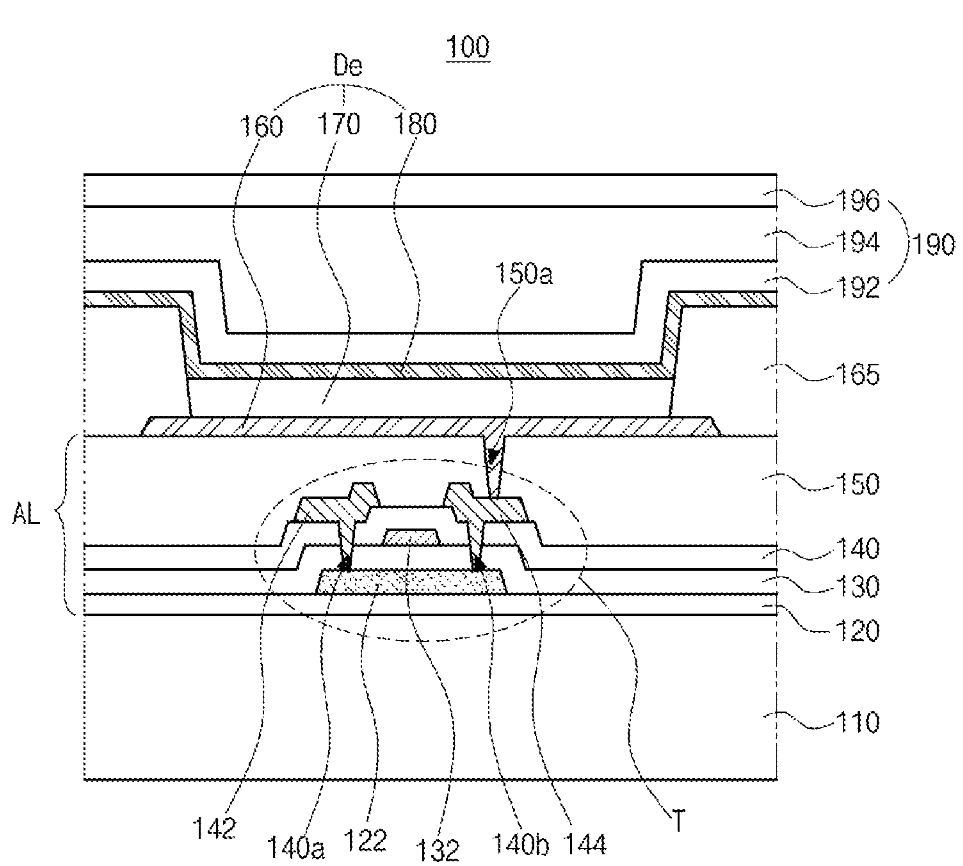
FIG. 1 is a schematic cross-sectional view of a display panel of an organic light-emitting diode display device according to an aspect of the present disclosure.

FIG. 1 is a schematic cross-sectional view of a display panel of an organic light-emitting diode display device according to an aspect of the present disclosure and shows one sub-pixel.

In FIG. 1, the display panel 100 of the organic light-emitting diode display device according to the aspect of the present disclosure can include a substrate 110, an array layer AL, a light-emitting diode De, and an encapsulation layer 190. The array layer AL can include a thin film transistor T and a plurality of insulation layers 120, 130, 140, and 150, and the light-emitting diode De can include a first electrode 160, a light-emitting layer 170, and a second electrode 180.

Specifically, a buffer layer 120 can be formed on the substrate 110. The buffer layer 120 can be disposed over substantially an entire surface of the substrate 110. The substrate 110 can be a glass substrate or a plastic substrate. For example, polyimide (PI) can be used for the plastic substrate, but aspects are not limited thereto. The buffer layer 120 can be formed of an inorganic material such as silicon oxide ($SiO_2$) and silicon nitride (SiNx), and can have a single-layer structure or a multiple-layer structure.

A semiconductor layer 122 can be patterned and formed on the buffer layer 120. The semiconductor layer 122 can be formed of an oxide semiconductor material. In this case, a shield pattern can be further formed under the semiconductor layer 122. The shield pattern can block light incident on the semiconductor layer 122, thereby preventing the semiconductor layer 122 from being degraded due to the light.

Alternatively, the semiconductor layer 122 can be formed of polycrystalline silicon. In this case, both ends of the semiconductor layer 122 can be doped with impurities.

A gate insulation layer 130 of an insulating material can be formed on the semiconductor layer 122 over substantially the entire surface of the substrate 110. The gate insulation layer 130 can be formed of an inorganic insulating material such as silicon oxide ($SiO_2$) or silicon nitride (SiNx).

Here, when the semiconductor layer 122 is formed of an oxide semiconductor material, the gate insulation layer 130 can be formed of silicon oxide ($SiO_2$). Alternatively, when the semiconductor layer 122 is formed of polycrystalline, the gate insulation layer 130 can be formed of silicon oxide ($SiO_2$) or silicon nitride (SiNx).

Next, a gate electrode 132 of a conductive material such as metal can be formed on the gate insulation layer 130 to correspond to a central portion of the semiconductor layer 122. In addition, a gate line can be formed on the gate insulation layer 130, and the gate line can extend in a first direction.

Meanwhile, in the aspect of the present disclosure, the gate insulation layer 130 can be formed over substantially the entire surface of the substrate 110. However, the gate insulation layer 130 can be patterned to have the same shape as the gate electrode 132.

An interlayer insulation layer 140 of an insulating material can be formed on the gate electrode 132 over substantially the entire surface of the substrate 110. The interlayer insulation layer 140 can be formed of an inorganic insulating material such as silicon oxide ($SiO_2$) or silicon nitride (SiNx) or can be formed of an organic insulating material such as photo acryl or benzocyclobutene.

The interlayer insulation layer 140 can have first and second contact holes **140*a* and 140*b* exposing top surfaces of both ends of each of the semiconductor layer 122. The first and second contact holes 140*a* and 140*b* can be disposed at both sides of the gate electrode 132 and spaced apart from the gate electrode 132. The first and second contact holes 140*a* and 140*b* can also be formed in the gate insulation layer 130. Alternatively, when the gate insulation layer 130 is patterned to have the same shape as the gate electrode 132, the first and second contact holes 140*a* and 140*b* can be formed only in the interlayer insulation layer 140**.

Next, source and drain electrodes 142 and 144 of a conductive material such as metal can be formed on the interlayer insulation layer 140. In addition, a data line and a power line, which can extend in a second direction, can be formed on the interlayer insulation layer 140.

The source and drain electrodes 142 and 144 can be spaced part from each other with respect to the gate electrode 132 and be in contact with the both ends of the semiconductor layer 122 through the first and second contact holes **140*a* and 140*b***, respectively. Although not shown in the figure, the data line extending in the second direction can cross the gate line to define a pixel region corresponding to each sub-pixel, and the power line providing a high potential voltage can be spaced apart from and parallel to the data line.

Meanwhile, the semiconductor layer 122, the gate electrode 132, and the source and drain electrodes 142 and 144 can constitute a thin film transistor T. Here, the thin film transistor T can have a coplanar structure in which the gate electrode 132 and the source and drain electrodes 142 and 144 are disposed at one side of the semiconductor layer 122, that is, over the semiconductor layer 122.

Alternatively, the thin film transistor T can have an inverted staggered structure in which the gate electrode is disposed under the semiconductor layer and the source and drain electrodes 142 and 144 are disposed over the semiconductor layer. In this case, the semiconductor layer can be formed of an oxide semiconductor material or amorphous silicon.

One or more thin film transistors having the same structure as the thin film transistor T can be further formed in each sub-pixel on the substrate 110, but aspects are not limited thereto.

A protection layer 150 of an insulating material can be formed on the source and drain electrodes 142 and 144 over substantially the entire surface of the substrate 110. The protection layer 150 can be formed of an organic insulating material such as photo acryl or benzocyclobutene. The protection layer 150 can have a flat top surface.

Meanwhile, an insulation layer of an inorganic insulating material such as silicon oxide ($SiO_2$) or silicon nitride (SiNx) can be further formed under the protection layer 150, that is, between the thin film transistor T and the protection layer 150.

The protection layer 150 can have a drain contact hole 150*a* exposing the drain electrode 144. Here, the drain contact hole 150*a* can be spaced apart from the second contact hole 140*b*. Alternatively, the drain contact hole 150*a* can be disposed directly over the second contact hole 140*b*.

Next, a first electrode 160 of a conductive material having relatively high work function can be formed on the protection layer 150. The first electrode 160 can be disposed in each sub-pixel and can be in contact with the drain electrode 144 through the drain contact hole 150*a*. For example, the first electrode 160 can be formed of a transparent conductive material such as indium tin oxide (ITO) and indium zinc oxide (IZO), but aspects are not limited thereto.

Meanwhile, the display panel 100 according to the aspect of the present disclosure can be a top-emission type, in which light from the light-emitting diode De is output toward a direction opposite the substrate 110. Accordingly, the first electrode 160 can further include a reflection electrode or a reflection layer of a metal material having relatively high reflectance below the transparent conductive material. For example, the reflection electrode or reflection layer can be formed of an aluminum-palladium-copper (APC) alloy, silver (Ag) or aluminum (Al). In this case, the first electrode 160 can have a triple-layer structure of ITO/APC/ITO, ITO/Ag/ITO or ITO/Al/ITO, but aspects are not limited thereto.

A bank 165 of an insulating material can be formed on the first electrode 160. The bank 165 can overlap with and cover edges of the first electrode 160 and can expose a central portion of the first electrode 160.

At least a top surface of the bank 165 can be hydrophobic, and a side surface of the bank 165 can be hydrophobic or hydrophilic. The bank 165 can be formed of an organic insulating material having a hydrophobic property. Alternatively, the bank 165 can be formed of an organic insulating material having a hydrophilic property and can be subjected to a hydrophobic treatment.

In the present disclosure, the bank 165 can have a single-layer structure. However, the bank 165 can have a double-layer structure. That is, the bank 165 can include a hydrophilic bank of a lower side and a hydrophobic bank of an upper side.

Next, a light-emitting layer 170 can be formed on the first electrode 160 exposed by the bank 165.

Although not shown in the figure, the light-emitting layer 170 can include a first charge auxiliary layer, a light-emitting material layer, and a second charge auxiliary layer sequentially stacked from a top surface of the first electrode 160. The light-emitting material layer can be formed of any one of red, green, and blue luminescent materials, but aspects are not limited thereto. The luminescent material can be an organic luminescent material, such as a phosphorescent compound or a fluorescent compound, or can be an inorganic luminescent material, such as a quantum dot.

The first charge auxiliary layer can be a hole auxiliary layer, and the hole auxiliary layer can include at least one of a hole injection layer (HIL) and a hole transport layer (HTL). In addition, the second charge auxiliary layer can be an electron auxiliary layer, and the electron auxiliary layer can include at least one of an electron injection layer (EIL) and an electron transport layer (ETL).

The light-emitting layer 170 can be formed through an evaporation process. In this case, in order to pattern the light-emitting layer 170 for each sub-pixel, a fine metal mask (FMM) can be used. Alternatively, the light-emitting layer 170 can be formed through a solution process. In this case, the light-emitting layer 170 can be provided only inside the bank 165, and a height of the light-emitting layer 170 in a region adjacent to the bank 165 can rise as it gets closer to the bank 165.

A second electrode 180 of a conductive material, having relatively low work function, can be formed on the light-emitting layer 170 over substantially the entire surface of the substrate 110. The second electrode 180 can be formed of aluminum, magnesium, silver, or an alloy thereof. At this time, the second electrode 180 can have a relatively thin thickness such that light from the light-emitting layer 170 can be transmitted therethrough.

Alternatively, the second electrode 180 can be formed of a transparent conductive material such as indium gallium oxide (IGO), but aspects are not limited thereto.

The first electrode 160, the light-emitting layer 170, and the second electrode 180 can constitute the light-emitting diode De. Here, the first electrode 160 can serve as an anode, and the second electrode 180 can serve as a cathode.

As described above, the display panel 100 according to the aspect of the present disclosure can be a top-emission type, in which light from the light-emitting diode De is output toward a direction opposite the substrate 110, that is, is output through the second electrode 180. The top-emission type display panel can have a wider emission region than a bottom-emission type display panel of the same size, which can improve luminance and reduce power consumption.

The encapsulation layer 190 can be formed on the second electrode 180 over substantially the entire surface of the substrate 110. The encapsulation layer 190 can prevent moisture or oxygen from being introduced into the light-emitting diode De from the outside.

The encapsulation layer 190 can have a stacked structure of a first inorganic layer 192, an organic layer 194, and a second inorganic layer 196. Here, the organic layer 194 can be a layer that covers particles generated during a manufacturing process.

Although there is no limit to a viewing angle of the organic light-emitting diode display device including the display panel 100, it is recently required to limit the viewing angle for reasons of privacy protection and information protection.

In addition, when the organic light-emitting diode display device is used as a display for providing driving information for a vehicle, an image displayed by the organic light-emitting diode display device can be reflected on the windscreen of the vehicle and can obstruct the driver's view. The reflection of the image in the vehicle can be particularly severe when driving at night, which interferes with safe driving. Accordingly, it is required to limit the viewing angle of the organic light-emitting diode display device applied to the vehicle.

In the present disclosure, the viewing angle of the organic light-emitting diode display device can be limited by using a lens.

Figure 2:
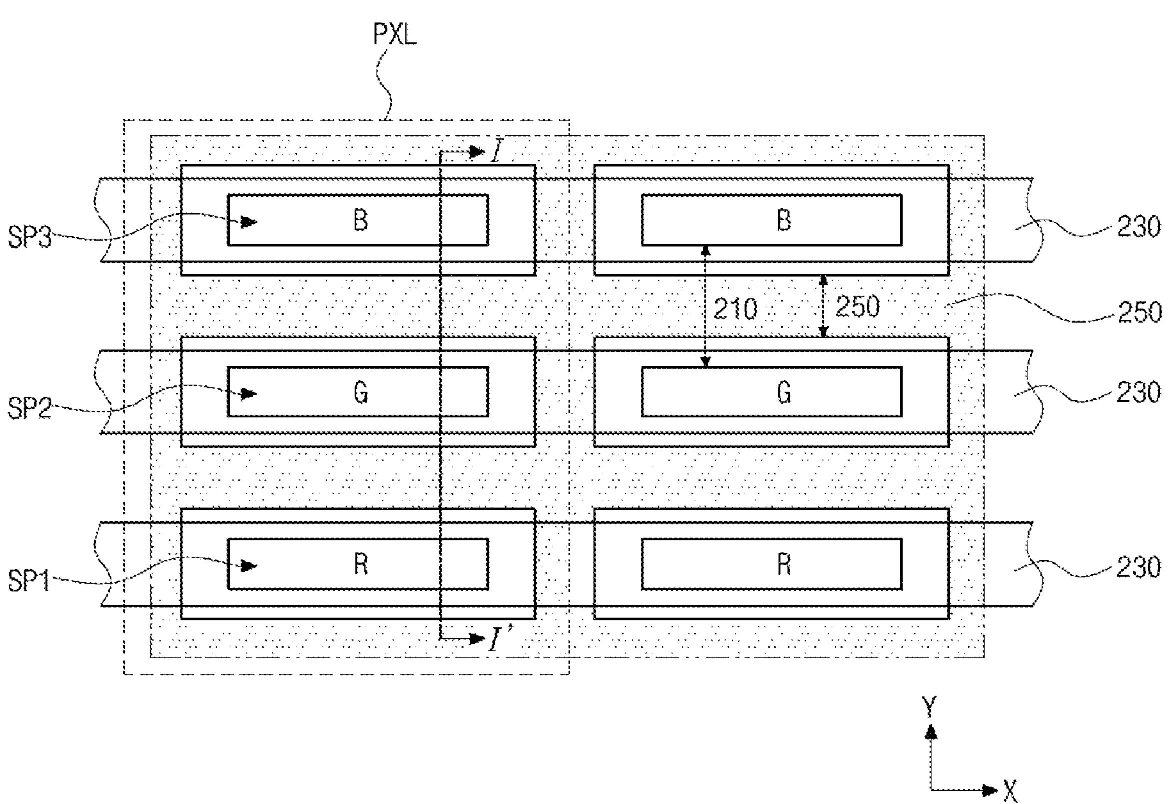
FIG. 2 is a schematic plan view of an organic light-emitting diode display device according to a first aspect of the present disclosure.

FIG. 2 is a schematic plan view of an organic light-emitting diode display device according to a first aspect of the present disclosure and mainly shows configurations of lenses and black matrixes.

In FIG. 2, the organic light-emitting diode display device according to the first aspect of the present disclosure can include a plurality of pixels PXL, and each pixel PXL can include first, second, and third sub-pixels SP1, SP2, and SP3. For example, the first, second, and third sub-pixels SP1, SP2, and SP3 can be red, green, and blue sub-pixels R, G, and B, respectively.

The sub-pixels SP1, SP2, and SP3 of different colors can be sequentially disposed along a first direction, which is a Y direction in the context of the figure, and the sub-pixels SP1, SP2, and SP3 of the same color can be disposed along a second direction, which is an X direction in the context of the figure. Each sub-pixel SP1, SP2, and SP3 can have a bar shape in which a length of the second direction is longer than a length of the first direction.

A light-emitting diode and a color filter can be provided in each sub-pixel SP1, SP2, and SP3, which will be described in detail later.

The first, second, and third sub-pixels SP1, SP2, and SP3 can have different sizes. The sizes of the first, second, and third sub-pixels SP1, SP2, and SP3 can be determined by considering the lifetime and luminous efficiency of a light-emitting diode provided at each sub-pixel. For example, the size of the third sub-pixel SP3 can be larger than the size of the first sub-pixel SP1 and smaller than the size of the second sub-pixel SP2. However, the present disclosure is not limited thereto. Alternatively, the size of the second sub-pixel SP2 can be larger than the size of the first sub-pixel SP1 and smaller than the size of the third sub-pixel SP3. Or, the sizes of the first, second, and third sub-pixels SP1, SP2, and SP3 can be the same.

First and second black matrixes 210 and 250 can be provided and can have openings corresponding to each sub-pixel SP1, SP2, and SP3. Here, a width of the first black matrix 210 can be greater than a width of the second black matrix 250 along the first direction.

In addition, a plurality of lenses 230 can be provided to correspond to the first, second, and third sub-pixels SP1, SP2, and SP3, respectively. The plurality of lenses 230 can extend in the second direction and can be spaced apart from each other in the first direction. Accordingly, one lens 230 can correspond to each sub-pixel row including the sub-pixels SP1, SP2, and SP3 arranged along the second direction. The lens 230 can be a semi-cylindrical lens.

Each lens 230 can overlap with the first black matrix 210 and can be spaced apart from the second black matrix 250 along the first direction.

A cross-sectional configuration of the organic light-emitting diode display device according to the first aspect of the present disclosure will be described in detail with reference to FIGS. 3 and 4.

Figure 3:
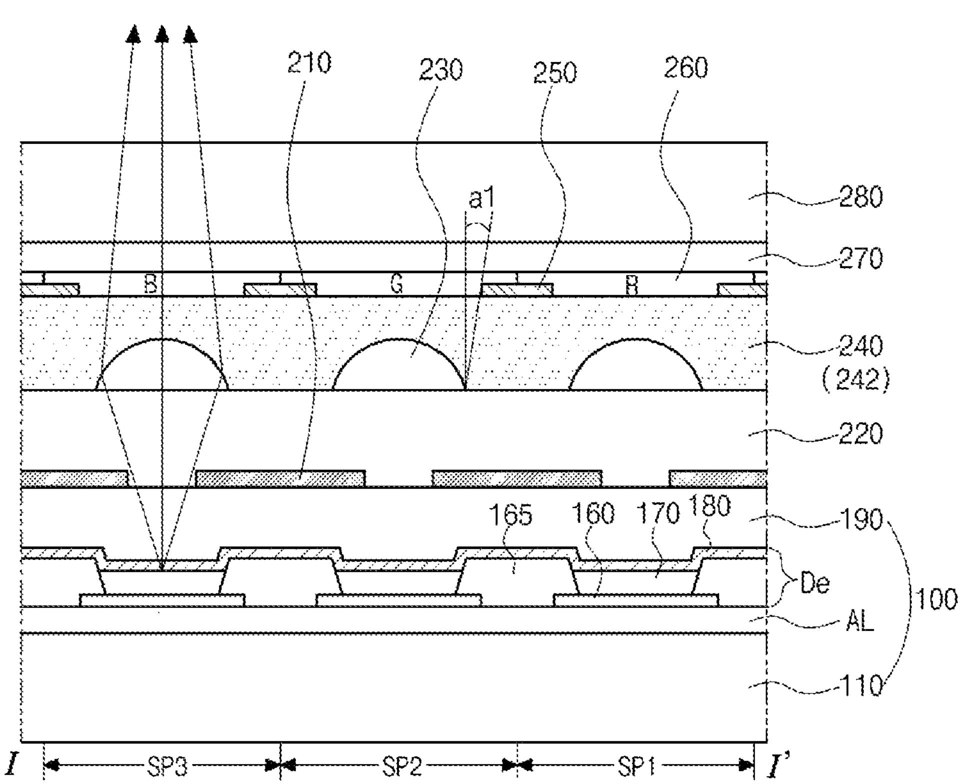
FIG. 3 is a schematic cross-sectional view of the organic light-emitting diode display device according to the first aspect of the present disclosure.
Figure 4:
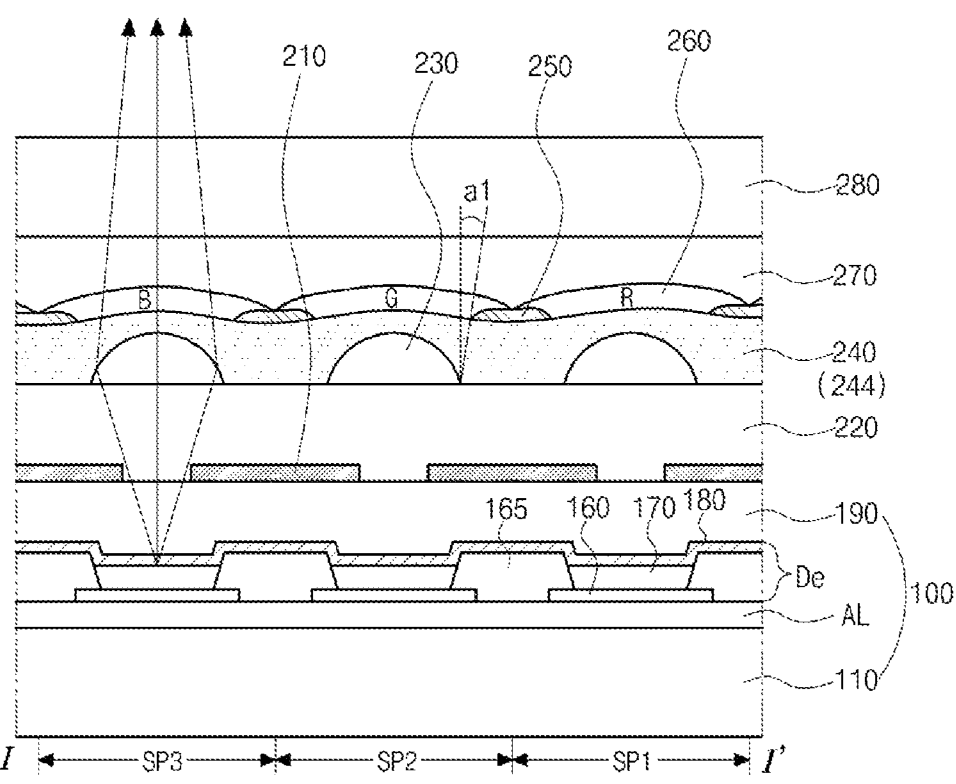
FIG. 4 is a schematic cross-sectional view of another example of the organic light-emitting diode display device according to the first aspect of the present disclosure.

FIG. 3 is a schematic cross-sectional view of the organic light-emitting diode display device according to the first aspect of the present disclosure, and FIG. 4 is a schematic cross-sectional view of another example of the organic light-emitting diode display device according to the first aspect of the present disclosure. FIGS. 3 and 4 show cross-sections corresponding to the line I-I' of FIG. 2.

In FIGS. 3 and 4, the organic light-emitting diode display device according to the first aspect of the present disclosure can include a display panel 100, the first black matrix 210, the lenses 230, a translucent overcoat layer 240, the second black matrix 250, a color filter layer 260, and a cover window 280.

The display panel 100 can include a substrate 110, an array layer AL, light-emitting diodes De, and an encapsulation layer 190, and can have the configuration of FIG. 1.

The light-emitting diodes De can be provided on the array layer AL at the first, second, and third sub-pixels SP1, SP2, and SP3, respectively, and each light-emitting diode De can include a first electrode 160, a light-emitting layer 170, and a second electrode 180.

The light-emitting diodes De of the first, second, and third sub-pixels SP1, SP2, and SP3 can emit red, green, and blue lights, respectively. Alternatively, the light-emitting diodes De of the first, second, and third sub-pixels SP1, SP2, and SP3 can emit white light.

Next, the encapsulation layer 190 having a flat top surface can be provided on the light-emitting diodes De to protect the light-emitting diodes De from moisture and oxygen.

The first black matrix 210 can be provided on the display panel 100, more specifically, on the encapsulation layer 190. The first black matrix 210 can have an opening corresponding to each sub-pixel SP1, SP2, and SP3.

The first black matrix 210 can be formed of a black resin or chromium oxide, but the aspects are not limited thereto.

An optical gap layer 220 can be provided on the first black matrix 210. The optical gap layer 220 can secure an optical gap between the light-emitting diodes De and the lenses 230, so that light from the light-emitting diodes De can be refracted in a predetermined direction by the lenses 230, thereby improving the efficiency of the lenses 230. The optical gap layer 220 can have a thickness of several to several tens of μm and can be formed of an organic insulating material.

For example, the optical gap layer 220 can be formed of photo acryl, benzocyclobutene (BCB), polyimide (PI), or polyamide (PA), but aspects are not limited thereto.

The lenses 230 can be provided on the optical gap layer 220 to correspond to the first, second, and third sub-pixels SP1, SP2, and SP3, respectively. The lenses 230 can have a cross-section of a semi-cylindrical shape. The lenses 230 can overlap with the first black matrix 210.

Light emitted from the light-emitting diode De of each sub-pixel SP1, SP2, and SP3 can be output at a predetermined angle due to the lenses 230, thereby limiting the viewing angle.

The translucent overcoat layer 240 can be provided on the lenses 230. The translucent overcoat layer 240 can have a transmittance of about 50% to about 70%. In addition, a refractive index of the translucent overcoat layer 240 can be smaller than a refractive index of the lenses 230.

The translucent overcoat layer 240 can protect the lenses 230. The translucent overcoat layer 240 can include a transparent resin and also include black pigment particles or dye-type materials therein. For example, the black pigment particles can include carbon black, titan black, or the like, and the transparent resin can include an acryl resin, a polyimide resin, a polyurethane resin, or the like. However, aspects are not limited.

As shown in FIG. 3, the translucent overcoat layer 242 can have a flat top surface and can serve as a planarization layer.

Alternatively, as shown in FIG. 4, the translucent overcoat layer 244 can have an uneven top surface in which a height corresponding to a portion between adjacent lenses 230 is lower than a height corresponding to a center of each lens 230. Specifically, a thickness of the translucent overcoat layer 244 overlapping with the lenses 230 can be thinner than a thickness of the translucent overcoat layer 244 not overlapping with the lenses 230. The top surface of the translucent overcoat layer 244 overlapping with the lenses 230 can protrude convexly above the top surface of the translucent overcoat layer 244 not overlapping with the lenses 230.

The thickness of the translucent overcoat layer 240, beneficially, can be about 0.5 to 2 times the thickness of the lenses 230. At this time, the thickness of the translucent overcoat layer 240 means the thickness right over the lenses 230. For example, the thickness of the translucent overcoat layer 240 can be about 3 μm to about 10 μm, but aspects are not limited thereto.

The second black matrix 250 can be provided on the translucent overcoat layer 240. The second black matrix 250 can have an opening corresponding to each sub-pixel SP1, SP2, and SP3, and the width of the second black matrix 250 can be smaller than the width of the first black matrix 210.

Here, the second black matrix 250 can be spaced apart from the lenses 230. In this case, the second black matrix 250 can have a predetermined angle a1 from the lenses 230 with respect to a direction perpendicular to the substrate 110. The angle a1 can vary according to the width of the second black matrix 250. That is, the wider the width of the second black matrix 250, the smaller the angle a1. For example, the angle a1 can be 30 degrees to 60 degrees. If the angle a1 is smaller than 30 degrees, light output to the desired viewing angle can be blocked, thereby lowering the luminance. On the other hand, if the angle a1 is greater than 60 degrees, light incident on the corresponding sub-pixel SP1, SP2, and SP3 from the sub-pixel SP1, SP2, and SP3 adjacent thereto cannot be blocked, thereby generating a cross-talk.

The second black matrix 250 can be formed of a black resin or chromium oxide, but aspects are not limited thereto. The second black matrix 250 can be formed of the same material as the first black matrix 210. Alternatively, the black matrix 250 can be formed of a different material from the first black matrix 210.

The color filter layer 260 can be provided on the second black matrix 250. The color filter layer 260 can include red (R), green (G), and blue (B) color filters corresponding to the first, second, and third sub-pixels SP1, SP2, and SP3, respectively.

As shown in FIG. 4, when the translucent overcoat layer 244 has the uneven top surface, that is, when the top surface of the translucent overcoat layer 244 has a protrusion protruding convexly upward, each of the R, G, and B color filters can have a protruding top surface corresponding to the top surface of the translucent overcoat layer 244.

The transmittance of the color filter layer 260 can be about 50% to about 80%. A thickness of the color filter layer 260 can be about 2 μm to about 5 μm, but aspects are not limited thereto.

The cover window 280 can be provided on the color filter layer 260. The cover window 280 can protect the display panel 100 from external impacts, moisture, or heat and can be formed of a transparent glass or plastic. For example, the cover window 280 can be formed of plastic such as polymehtylmethacrylate (PMMA), polyimide (PI), or polyethyleneterephthalate (PET) or formed of ultrathin glass (UTG), but aspects are not limited thereto.

The cover window 280 can be attached to the color filter layer 260 via an adhesive layer 270. The adhesive layer 270 can be an optically clear adhesive (OCA), and can block ultraviolet rays. However, the present disclosure is not limited thereto, and all clear adhesives can be used as the adhesive layer 270.

As described above, in the organic light-emitting diode display device according to the first aspect of the present disclosure, the viewing angle can be limited by providing the lenses 230 and the first black matrix 210.

In this case, each sub-pixel SP1, SP2, and SP3 can be implemented in a bar shape to match the extending direction of the lenses 230. Accordingly, since most of the emission area of each sub-pixel SP1, SP2, and SP3 can contribute to the image display, it is possible to secure a relatively high aperture ratio.

In addition, the translucent overcoat layer 240 and the color filter layer 260 can be provided over the lenses to absorb the external light, so that the external light can be blocked from being reflected by the metal layer of the display panel 100 and then being output to the outside. Accordingly, the polarizing plate can be omitted, thereby reducing the costs. Since the transmittance of the translucent overcoat layer 240 and the color filter layer 260 is higher than that of the polarizing plate, the luminance can be improved.

Moreover, the second black matrix 250 can be provided over the first black matrix 210, and the width of the second black matrix 250 can be controlled, so that the viewing angle and the reflection of the external light can be further blocked and the crosstalk between adjacent sub-pixels SP1, SP2, and SP3 can be prevented.

Figure 5:
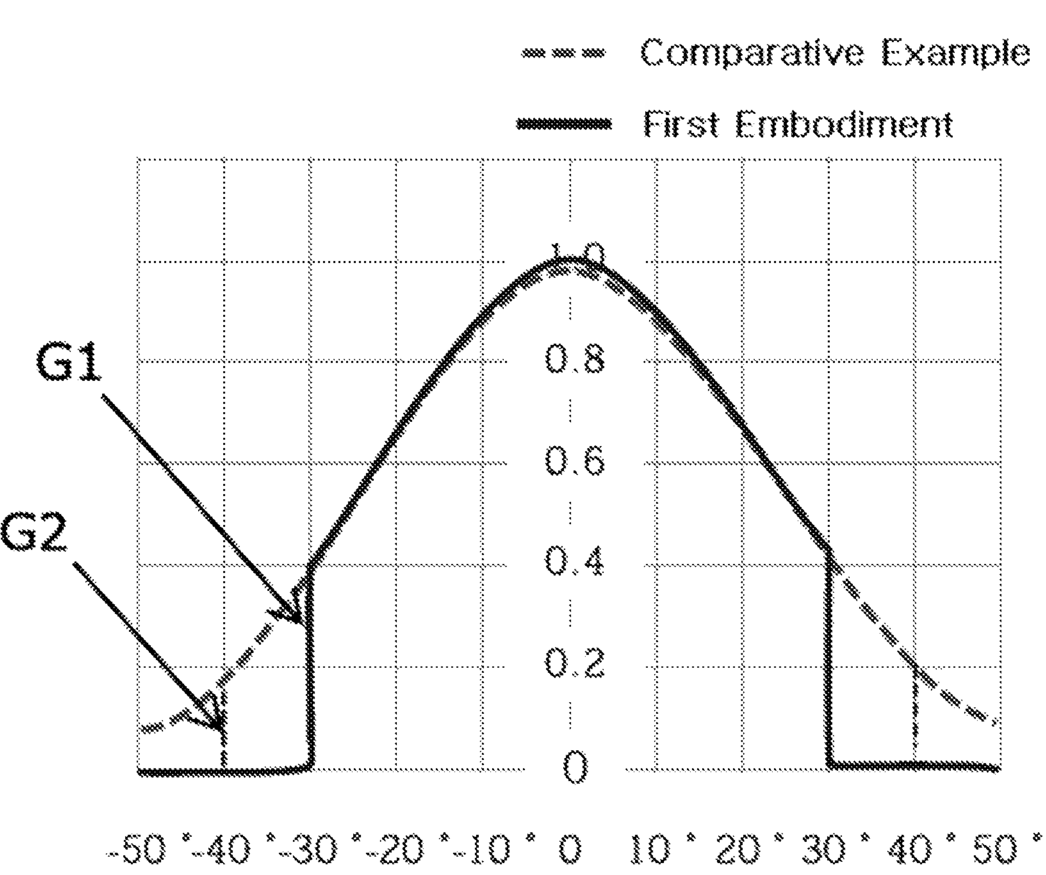
FIG. 5 is a graph showing the viewing angle of the organic light-emitting diode display device according to the first aspect of the present disclosure.

FIG. 5 is a graph showing the viewing angle of the organic light-emitting diode display device according to the first aspect of the present disclosure and also shows the viewing angle of the comparative example. Here, an organic light-emitting diode display device of the comparative example includes lenses and only a black matrix under the lenses.

In FIG. 5, the organic light-emitting diode display device according to the first aspect of the present disclosure includes the second black matrix 250 over the lenses 230 compared to the comparative example, so that the viewing angle can be further limited. Here, it can be seen that the width of the second black matrix 250 corresponding to G1 is larger than the width of the second black matrix 250 corresponding to G2, and the larger the width of the second black matrix 250, the smaller the angle a1 from the lenses 230, the smaller the viewing angle.

Meanwhile, the organic light-emitting diode display device of the present disclosure can have a different viewing angle for each area. An organic light-emitting diode display device according to a second aspect of the present disclosure will be described in detail with reference to FIG. 6 and FIG. 7. The organic light-emitting diode display device according to the second aspect of the present disclosure has substantially the same configuration as that of the first aspect except for the second black matrix. The same parts as that of the first aspect are designated by the same reference signs, and explanation for the same parts will be shortened or omitted.

Figure 6:
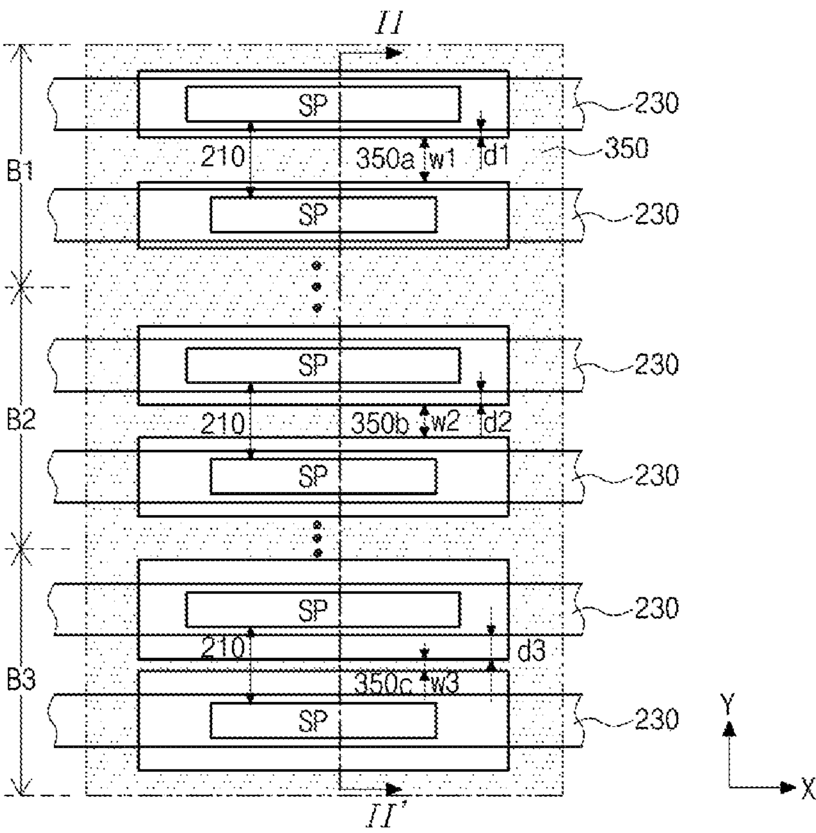
FIG. 6 is a schematic plan view of an organic light-emitting diode display device according to a second aspect of the present disclosure.

FIG. 6 is a schematic plan view of an organic light-emitting diode display device according to a second aspect of the present disclosure and mainly shows configurations of lenses and black matrixes.

In FIG. 6, the organic light-emitting diode display device according to the second aspect of the present disclosure can include at least two regions having different widths of a second black matrix 350 along a first direction, which is the Y direction in the context of the figure.

Specifically, the organic light-emitting diode display device according to the second aspect of the present disclosure can include first, second, and third regions B1, B2, and B3. A plurality of sub-pixels SP can be provided in each region B1, B2, and B3. Each sub-pixel SP can have a bar shape in which a length of a second direction, which is the X direction in the context of the figure, is longer than a length of the first direction.

First and second black matrixes 210 and 350 can be provided and can have openings corresponding to each sub-pixel SP. Here, a width of the first black matrix 210 can be greater than a width of the second black matrix 350 along the first direction. In this case, the widths of the first black matrix 210 can be the same in the first, second, and third regions B1, B2, and B3. On the other hand, the widths of the second black matrix 350 can be different from each other in the first, second, and third regions B1, B2, and B3.

The second black matrix 350*a* in the first region B1 can have a first width w1, the second black matrix 350*b* in the second region B2 can have a second width w2, and the second black matrix 350*c* in the third region B3 can have a third width w3. The second width w2 can be smaller than the first width w1 and larger than the third width w3.

Next, lenses 230 can be provided to correspond to respective sub-pixels SP. The lenses 230 can be semi-cylindrical lenses, which extend in the second direction and are spaced apart from each other in the first direction.

Each lens 230 can overlap with the first black matrix 210 and can be spaced apart from the second black matrix 350 along the first direction. In the first, second, and third regions B1, B2, and B3, distances between the lenses 230 and the second black matrix 350 can be different from each other.

In this case, a distance d2 between the lens 230 and the second black matrix 350*b* in the second region B2 can be larger than a distance d1 between the lens 230 and the second black matrix 350*a* in the first region B1 and smaller than a distance d3 between the lens 230 and the second black matrix 350*c* in the third region B3. As described above, the smaller the width of the second black matrix 350*a*, 350*b*, and 350*c*, the larger the distance d2 between the lenses 230 and the second black matrix 350*a*, 350*b*, and 350*c*, and the larger the viewing angle.

Accordingly, the viewing angle can be narrow in the first region B1, which is disposed on the upper side in the context of the figure, and can be wide in the third region B3, which is disposed on the lower side.

Figure 7:
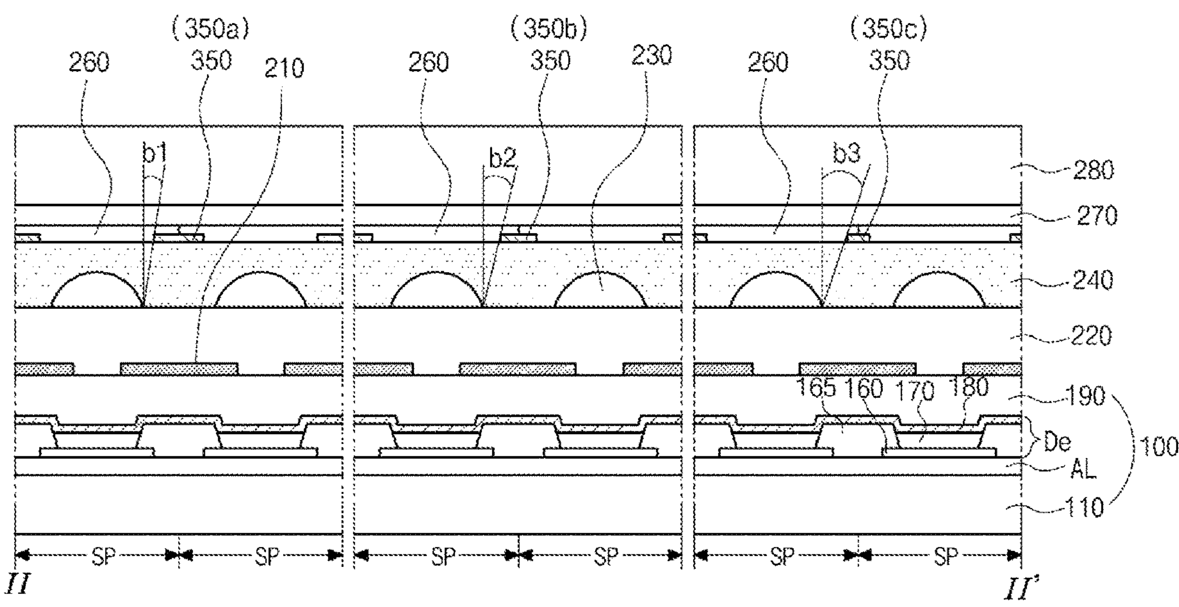
FIG. 7 is a schematic cross-sectional view of the organic light-emitting diode display device according to the second aspect of the present disclosure.

FIG. 7 is a schematic cross-sectional view of the organic light-emitting diode display device according to the second aspect of the present disclosure and shows a cross-section corresponding to the line II-IF of FIG. 6.

In FIG. 7, the organic light-emitting diode display device according to the second aspect of the present disclosure can include the display panel 100, the first black matrix 210, the lenses 230, the translucent overcoat layer 240, the second black matrix 350, the color filter layer 260, and the cover window 280.

The display panel 100 can include the substrate 110, the array layer AL, the light-emitting diodes De, and the encapsulation layer 190, and can have the configuration of FIG. 1.

The light-emitting diodes De can be provided on the array layer AL at the sub-pixels SP, respectively, and each light-emitting diode De can include the first electrode 160, the light-emitting layer 170, and the second electrode 180.

The encapsulation layer 190 having a flat top surface can be provided on the light-emitting diodes De to protect the light-emitting diodes De from moisture and oxygen.

The first black matrix 210 can be provided on the display panel 100, more specifically, on the encapsulation layer 190. The first black matrix 210 can have an opening corresponding to each sub-pixel SP.

The optical gap layer 220 can be provided on the first black matrix 210. The optical gap layer 220 can secure an optical gap between the light-emitting diodes De and the lenses 230, thereby improving the efficiency of the lenses 230. The optical gap layer 220 can be formed of an organic insulating material.

The lenses 230 can be provided on the optical gap layer 220 to correspond to the sub-pixels SP, respectively. The lenses 230 can have a cross-section of a semi-cylindrical shape. The lenses 230 can overlap with the first black matrix 210.

The translucent overcoat layer 240 can be provided on the lenses 230. The translucent overcoat layer 240 can have a transmittance of about 50% to about 70%. In addition, a refractive index of the translucent overcoat layer 240 can be smaller than a refractive index of the lenses 230.

The translucent overcoat layer 240 can include a transparent resin and also include black pigment particles or dye-type materials therein. For example, the black pigment particles can include carbon black, titan black, or the like, and the transparent resin can include an acryl resin, a polyimide resin, a polyurethane resin, or the like. However, aspects are not limited.

The thickness of the translucent overcoat layer 240, beneficially, can be about 0.5 to 2 times the thickness of the lenses 230. At this time, the thickness of the translucent overcoat layer 240 means the thickness right over the lenses 230, but aspects are not limited thereto. For example, the thickness of the translucent overcoat layer 240 can be about 3 μm to about 10 μm.

The second black matrix 350 can be provided on the translucent overcoat layer 240. The second black matrix 350 can have an opening corresponding to each sub-pixel SP, and the width of the second black matrix 350 can be smaller than the width of the first black matrix 210.

As described above, the widths of the second black matrix 350 can be different from each other in the first, second, and third regions B1, B2, and B3. The width of the second black matrix 350*b* of the second region B2 can be smaller than the width of the second black matrix 350*a* of the first region B1 and larger than the width of the second black matrix 350*c* of the third region B3.

The second black matrix 350 can be spaced apart from the lenses 230. In this case, the second black matrix 350 can have first, second, and third angles b1, b2, and b3 from the lenses 230 with respect to a direction perpendicular to the substrate 110 in the first, second, and third regions B1, B2, and B3, respectively. The second angle b2 can be larger than the first angle b1 and smaller than the third angle b3. For example, the first angle b1 can be 30 degrees, the second angle b2 can be 45 degrees, and the third angle b3 can be 60 degrees. However, aspects are not limited thereto.

The color filter layer 260 can be provided on the second black matrix 350. The color filter layer 260 can include red (R), green (G), and blue (B) color filters corresponding to the sub-pixels SP, respectively.

The transmittance of the color filter layer 260 can be about 50% to about 80%. The thickness of the color filter layer 260 can be about 2 μm to about 5 μm, but aspects are not limited thereto.

The cover window 280 can be provided on the color filter layer 260. The cover window 280 can be formed of a transparent glass or plastic.

The cover window 280 can be attached to the color filter layer 260 via an adhesive layer 270. The adhesive layer 270 can be an optically clear adhesive (OCA), and can block ultra violet rays.

As described above, in the organic light-emitting diode display device according to the second aspect of the present disclosure, the viewing angles in the first, second, and third regions B1, B2, and B3 can be implemented differently from each other by differing the widths of the second black matrix 350.

The organic light-emitting diode display device of the present disclosure can have a different viewing angle for direction. An organic light-emitting diode display device according to a third aspect of the present disclosure will be described in detail with reference to FIG. 8 and FIG. 9. The organic light-emitting diode display device according to the third aspect of the present disclosure has substantially the same configuration as that of the first aspect except for the second black matrix. The same parts as that of the first aspect are designated by the same reference signs, and explanation for the same parts will be shortened or omitted.

Figure 8:
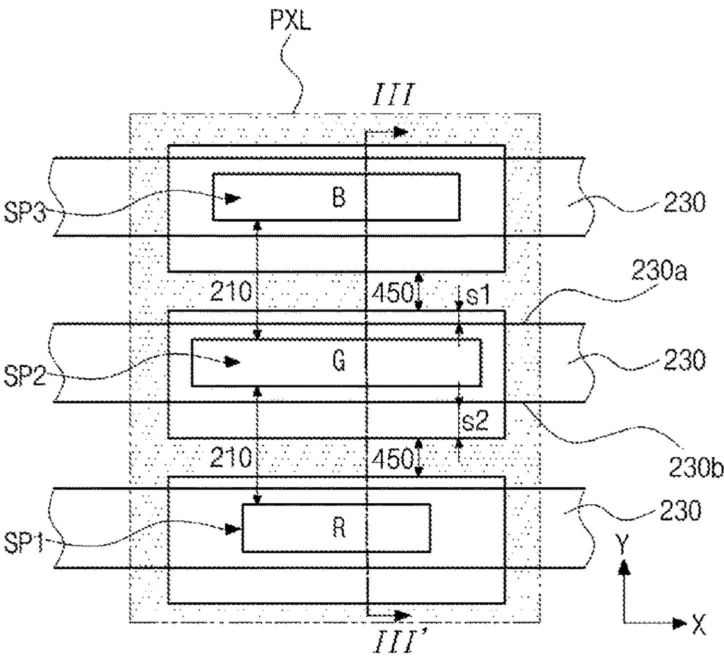
FIG. 8 is a schematic plan view of an organic light-emitting diode display device according to a third aspect of the present disclosure.

FIG. 8 is a schematic plan view of an organic light-emitting diode display device according to a third aspect of the present disclosure and mainly shows configurations of lenses and black matrixes.

In FIG. 8, a second black matrix 450 of the organic light-emitting diode display device according to the third aspect of the present disclosure can have an asymmetric structure with respect to a lens 230 along a first direction, which is the Y direction in the context of the figure.

Specifically, a pixel PXL of the organic light-emitting diode display device according to the third aspect of the present disclosure can include first, second, and third sub-pixels SP1, SP2, and SP3 along the first direction. Each of the first, second, and third sub-pixels SP1, SP2, and SP3 can have a bar shape in which a length of a second direction, which is the X direction in the context of the figure, is longer than a length of the first direction.

First and second black matrixes 210 and 450 can be provided and can have openings corresponding to each sub-pixel SP1, SP2, and SP3. Here, a width of the first black matrix 210 can be greater than a width of the second black matrix 450 along the first direction.

Next, lenses 230 can be provided to correspond to the first, second, and third sub-pixels SP1, SP2, and SP3, respectively. The lenses 230 can be semi-cylindrical lenses, which extend in the second direction and are spaced apart from each other in the first direction.

Each lens 230 can overlap with the first black matrix 210 and can be spaced apart from the second black matrix 450 along the first direction.

In this case, a distance s1 between a first side surface 230*a* of the lens 230 and the second black matrix 450 can be different from a distance s2 between a second side surface 230*b* of the lens 230 and the second black matrix 450. For example, the distance s1 between the first side surface 230*a* of the lens 230 and the second black matrix 450 can be smaller than the distance s2 between the second side surface 230*b* of the lens 230 and the second black matrix 450.

Accordingly, the viewing angle can be narrow at the first side direction and can be wide at the second side direction. That is, the viewing angle can be narrow at an upper side direction and can be wide at a lower side direction in the context of the figure.

Figure 9:
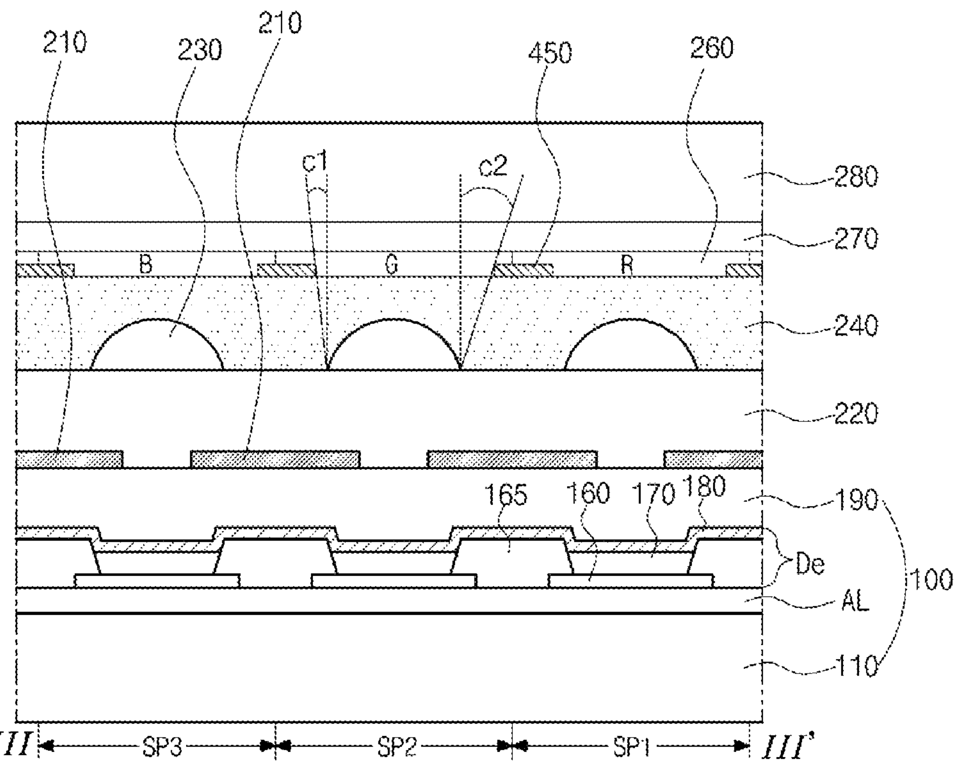
FIG. 9 is a schematic cross-sectional view of the organic light-emitting diode display device according to the third aspect of the present disclosure.

FIG. 9 is a schematic cross-sectional view of the organic light-emitting diode display device according to the third aspect of the present disclosure and shows a cross-section corresponding to the line of FIG. 8.

In FIG. 9, the organic light-emitting diode display device according to the third aspect of the present disclosure can include the display panel 100, the first black matrix 210, the lenses 230, the translucent overcoat layer 240, the second black matrix 450, the color filter layer 260, and the cover window 280.

The display panel 100 can include the substrate 110, the array layer AL, the light-emitting diodes De, and the encapsulation layer 190, and can have the configuration of FIG. 1.

The light-emitting diodes De can be provided on the array layer AL at the first, second, and third sub-pixels SP1, SP2, and SP3, respectively, and each light-emitting diode De can include the first electrode 160, the light-emitting layer 170, and the second electrode 180.

The encapsulation layer 190 having a flat top surface can be provided on the light-emitting diodes De to protect the light-emitting diodes De from moisture and oxygen.

The first black matrix 210 can be provided on the display panel 100, more specifically, on the encapsulation layer 190. The first black matrix 210 can have an opening corresponding to each sub-pixel SP1, SP2, and SP3.

The optical gap layer 220 can be provided on the first black matrix 210. The optical gap layer 220 can secure an optical gap between the light-emitting diodes De and the lenses 230, thereby improving the efficiency of the lenses 230. The optical gap layer 220 can be formed of an organic insulating material.

The lenses 230 can be provided on the optical gap layer 220 to correspond to the first, second, and third sub-pixels SP1, SP2, and SP3, respectively. The lenses 230 can have a cross-section of a semi-cylindrical shape. The lenses 230 can overlap with the first black matrix 210.

The translucent overcoat layer 240 can be provided on the lenses 230. The translucent overcoat layer 240 can have a transmittance of about 50% to about 70%. In addition, a refractive index of the translucent overcoat layer 240 can be smaller than a refractive index of the lenses 230.

The translucent overcoat layer 240 can include a transparent resin and also include black pigment particles or dye-type materials therein. For example, the black pigment particles can include carbon black, titan black, or the like, and the transparent resin can include an acryl resin, a polyimide resin, a polyurethane resin, or the like. However, aspects are not limited.

The thickness of the translucent overcoat layer 240, beneficially, can be about 0.5 to 2 times the thickness of the lenses 230. At this time, the thickness of the translucent overcoat layer 240 means the thickness right over the lenses 230, but aspects are not limited thereto. For example, the thickness of the translucent overcoat layer 240 can be about 3 μm to about 10 μm.

The second black matrix 450 can be provided on the translucent overcoat layer 240. The second black matrix 450 can have an opening corresponding to each sub-pixel SP1, SP2, and SP3, and the width of the second black matrix 450 can be smaller than the width of the first black matrix 210.

The second black matrix 450 can be spaced apart from the lenses 230. In this case, the distance between a first side of the lens 230 and the second black matrix 450 can be different from the distance between a second side of the lens 230 and the second black matrix 450. Specifically, the distance between a left side of the lens 230 and the second black matrix 450 can be smaller than the distance between a right side of the lens 230 and the second black matrix 450 in the context of the figure. Accordingly, a first angle c1 of the second black matrix 450 from the left side of the lens 230 with respect to the direction perpendicular to the substrate 110 can be smaller than a second angle c2 of the second black matrix 450 from the right side of the lens 230. For example, the first angle c1 can be 30 degrees, and the second angle c2 can be 45 degrees. However, aspects are not limited thereto.

The color filter layer 260 can be provided on the second black matrix 450. The color filter layer 260 can include red (R), green (G), and blue (B) color filters corresponding to the first, second, and third sub-pixels SP1, SP2, and SP3, respectively.

The transmittance of the color filter layer 260 can be about 50% to about 80%. The thickness of the color filter layer 260 can be about 2 μm to about 5 μm, but aspects are not limited thereto.

The cover window 280 can be provided on the color filter layer 260. The cover window 280 can be formed of a transparent glass or plastic.

The cover window 280 can be attached to the color filter layer 260 via an adhesive layer 270. The adhesive layer 270 can be an optically clear adhesive (OCA), and can block ultra violet rays.

As described above, in the organic light-emitting diode display device according to the third aspect of the present disclosure, the viewing angles according to the directions can be implemented differently from each other by forming the second black matrix 450 having an asymmetric structure with respect to the lenses 230.

Meanwhile, the organic light-emitting diode display device of the present disclosure can further block the reflection of the external light by changing the location and size of the second black matrix. An organic light-emitting diode display device according to a fourth aspect of the present disclosure will be described in detail with reference to FIG. 10. The organic light-emitting diode display device according to the fourth aspect of the present disclosure has substantially the same configuration as that of the first aspect except for the second black matrix, the translucent overcoat layer, and the color filter layer. The same parts as that of the first aspect are designated by the same reference signs, and explanation for the same parts will be shortened or omitted.

Figure 10:
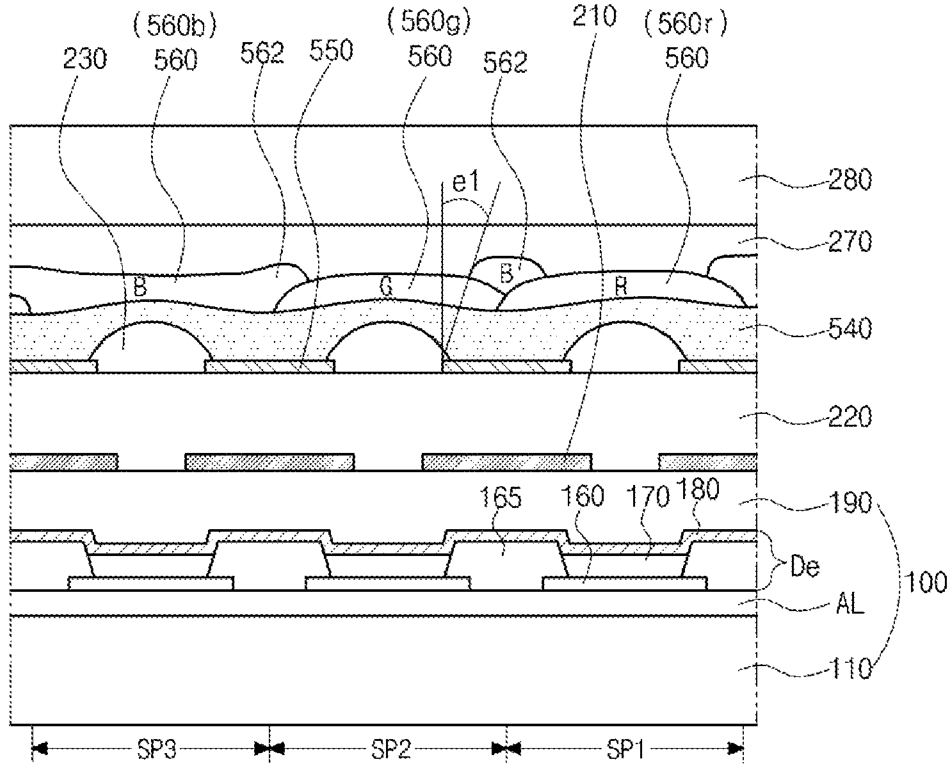
FIG. 10 is a schematic cross-sectional view of an organic light-emitting diode display device according to a fourth aspect of the present disclosure.

FIG. 10 is a schematic cross-sectional view of an organic light-emitting diode display device according to a fourth aspect of the present disclosure.

In FIG. 10, the organic light-emitting diode display device according to the third aspect of the present disclosure can include the display panel 100, the first black matrix 210, the lenses 230, the translucent overcoat layer 540, the second black matrix 550, the color filter layer 560, and the cover window 280.

The display panel 100 can include the substrate 110, the array layer AL, the light-emitting diodes De, and the encapsulation layer 190, and can have the configuration of FIG. 1.

The light-emitting diodes De can be provided on the array layer AL at the first, second, and third sub-pixels SP1, SP2, and SP3, respectively, and each light-emitting diode De can include the first electrode 160, the light-emitting layer 170, and the second electrode 180.

The encapsulation layer 190 having a flat top surface can be provided on the light-emitting diodes De to protect the light-emitting diodes De from moisture and oxygen.

The first black matrix 210 can be provided on the display panel 100, more specifically, on the encapsulation layer 190. The first black matrix 210 can have an opening corresponding to each sub-pixel SP1, SP2, and SP3.

The optical gap layer 220 can be provided on the first black matrix 210. The optical gap layer 220 can secure an optical gap between the light-emitting diodes De and the lenses 230, thereby improving the efficiency of the lenses 230. The optical gap layer 220 can be formed of an organic insulating material.

The second black matrix 550 can be provided on the optical gap layer 220. The second black matrix 550 can have an opening corresponding to each sub-pixel SP1, SP2, and SP3, and the width of the second black matrix 550 can be smaller than the width of the first black matrix 210.

The lenses 230 can be provided on the second black matrix 550 to correspond to the first, second, and third sub-pixels SP1, SP2, and SP3, respectively. The lenses 230 can have a cross-section of a semi-cylindrical shape. The lenses 230 can overlap with the first black matrix 210 and the second black matrix 550.

The translucent overcoat layer 540 can be provided on the lenses 230. The translucent overcoat layer 540 can have a transmittance of about 50% to about 70%. In addition, a refractive index of the translucent overcoat layer 540 can be smaller than a refractive index of the lenses 230.

The translucent overcoat layer 540 can include a transparent resin and also include black pigment particles or dye-type materials therein. For example, the black pigment particles can include carbon black, titan black, or the like, and the transparent resin can include an acryl resin, a polyimide resin, a polyurethane resin, or the like. However, aspects are not limited.

The translucent overcoat layer 540 can have an uneven top surface in which a height corresponding to a portion between adjacent lenses 230 is lower than a height corresponding to a center of each lens 230. Alternatively, the translucent overcoat layer 540 can have a flat top surface and can serve as a planarization layer. The thickness of the translucent overcoat layer 540, beneficially, can be about 0.5 to 2 times the thickness of the lenses 230. At this time, the thickness of the translucent overcoat layer 540 means the thickness right over the lenses 230, but aspects are not limited thereto. For example, the thickness of the translucent overcoat layer 540 can be about 3 μm to about 10 μm.

The color filter layer 560 can be provided on the translucent overcoat layer 540. The color filter layer 560 can include red (R), green (G), and blue (B) color filters 560*r*, 560*g*, and 560*b* corresponding to the first, second, and third sub-pixels SP1, SP2, and SP3, respectively.

The transmittance of the color filter layer 560 can be about 50% to about 80%. The thickness of the color filter layer 560 can be about 2 μm to about 5 μm, but aspects are not limited thereto.

Meanwhile, a light-blocking pattern 562 can be provided on the red and/or green color filters 560*r* and 560*g* to correspond to the second black matrix 550 and can be formed of the same material as the blue color filter 560*b*. The light-blocking pattern 562 can serve as a third black matrix.

The light-blocking pattern 562 can be spaced apart from the lenses 230. In this case, the light-blocking pattern 562 can have a predetermined angle e1 from the lenses 230 with respect to a direction perpendicular to the substrate 110. The angle e1 can vary according to the width of the light-blocking pattern 562. That is, the wider the width of the light-blocking pattern 562, the smaller the angle e1. For example, the angle e1 can be 30 degrees to 60 degrees. If the angle e1 is smaller than 30 degrees, light output to the desired viewing angle can be blocked, thereby lowering the luminance. On the other hand, if the angle e1 is greater than 60 degrees, light incident on the corresponding sub-pixel SP1, SP2, and SP3 from the sub-pixel SP1, SP2, and SP3 adjacent thereto cannot be blocked, thereby generating a cross-talk.

The cover window 280 can be provided on the color filter layer 560 and the light-blocking pattern 562. The cover window 280 can be formed of a transparent glass or plastic.

The cover window 280 can be attached to the color filter layer 260 via an adhesive layer 270. The adhesive layer 270 can be an optically clear adhesive (OCA), and can block ultra violet rays.

As described above, in the organic light-emitting diode display device according to the fourth aspect of the present disclosure, the second black matrix 550 can be disposed under the lenses 230 so as to overlap with the lenses 230, so that the size of the second black matrix 550 can be maximized, thereby further limiting the reflection of the external light.

The organic light-emitting diode display device of the present disclosure can be used as a display for providing driving information for a vehicle, and in this case, the arrangement angle of the sub-pixels can be different for each region. An organic light-emitting diode display device according to a fifth aspect of the present disclosure will be described in detail with reference to FIGS. 11, 12, and 13.

Figure 11:
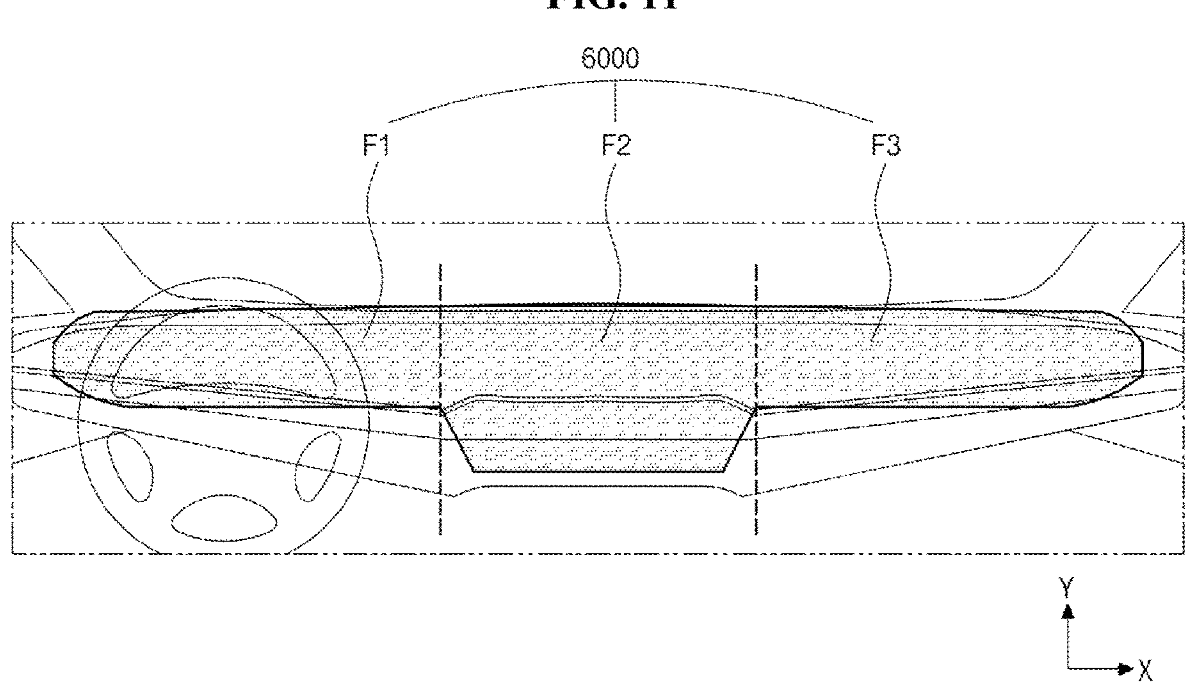
FIG. 11 is a view schematically illustrating an organic light-emitting diode display device according to a fifth aspect of the present disclosure applied to a display for a vehicle.
Figure 12:
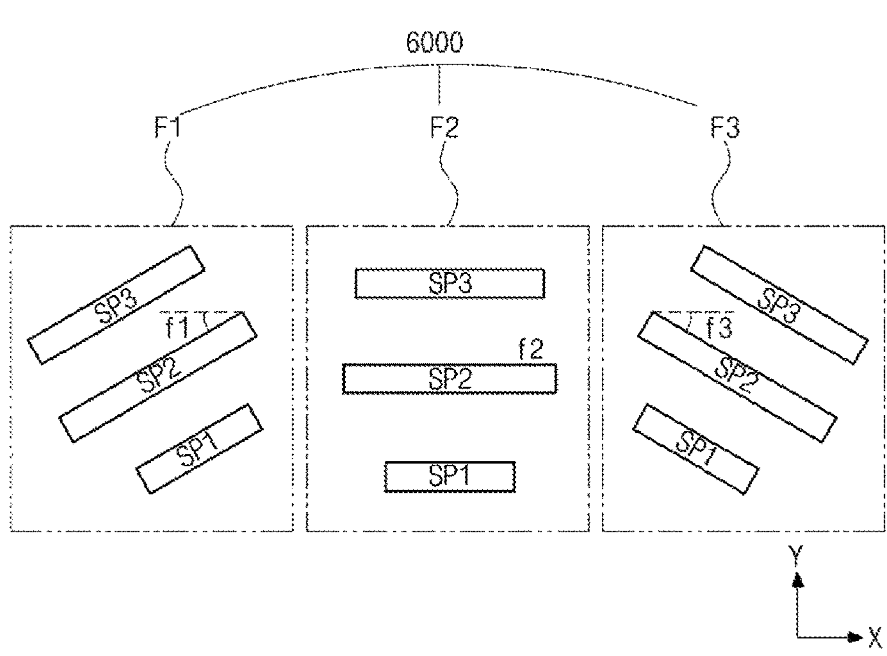
FIG. 12 is a view schematically illustrating a sub-pixel arrangement of the organic light-emitting diode display device according to the fifth aspect of the present disclosure.

FIG. 11 is a view schematically illustrating an organic light-emitting diode display device according to a fifth aspect of the present disclosure applied to a display for a vehicle, and FIG. 12 is a view schematically illustrating a sub-pixel arrangement of the organic light-emitting diode display device according to the fifth aspect of the present disclosure.

In FIG. 11 and FIG. 12, the organic light-emitting diode display device 6000 according to the fifth aspect of the present disclosure can be applied to a dashboard or the like of a vehicle and can include first, second, and third regions F1, F2, and F3 arranged along the second direction, which is the X direction.

The first region F1 can correspond to a cluster and can provide information such as driving speed, RPM, engine temperature, and fuel amount. The second region F2 can correspond to a center information display (CID) and can provide various convenient functions such as audio, video, navigation, air conditioning, and Bluetooth. The third region F3 can correspond to a co-driver display (CDD) and can provide entertainment functions and seat information for a passenger seated in the front passenger seat.

In each of the first, second, and third regions F1, F2, and F3, first, second, and third sub-pixels SP1, SP2, and SP3 can be provided along the first direction, which is the Y direction. The first, second, and third sub-pixels SP1, SP2, and SP3 can have the configurations of the first, second, third, and fourth aspects described above.

Each of the first, second, and third sub-pixel SP1, SP2, and SP3 can have a bar shape in which a length of the second direction is longer than a length of the first direction. The bar-shaped sub-pixels SP1, SP2, and SP3 can secure a relatively high aperture ratio, but the visual reflection in the form of a line perpendicular to the bar shape can appear due to the reflection of the external light. Accordingly, there is a problem that the driver's view can be obstructed by the reflected light, and the reflected light of the third region F3 farthest from the driver can have the greatest influence on the driver's view.

To solve the problem, the first, second, and third sub-pixels SP1, SP2, and SP3 of the third region F3 can be formed to be inclined at a predetermined angle in a clockwise direction with respect to the second direction.

In addition, in order to prevent the reflected light of the first region F1 from obstructing the view of the passenger in the front passenger's seat, the first, second, and third sub-pixels SP1, SP2, and SP3 of the first region F1 can be formed to be inclined at a predetermined angle in a counterclockwise direction with respect to the second direction.

Accordingly, the first, second, and third sub-pixels SP1, SP2, and SP3 of the first, second, and third regions F1, F2, and F3 can be disposed at a different angle for each region.

Specifically, the first, second, and third sub-pixels SP1, SP2, and SP3 of the first region F1 can be inclined at a first angle f1 in the counterclockwise direction with respect to the second direction, the first, second, and third sub-pixels SP1, SP2, and SP3 of the second region F2 can have a second angle f2 of 0 degree parallel to the second direction, and the first, second, and third sub-pixels SP1, SP2, and SP3 of the third region F3 can be inclined at a third angle f3 in the clockwise direction with respect to the second direction.

In this case, the first angle f1 and the third angle f3 can be the same, and the first, second, and third sub-pixels SP1, SP2, and SP3 of the first region F1 and the third region F3 can be symmetric with respect to the second region F2. Alternatively, the first angle f1 and the third angle f3 can be different, and the first, second, and third sub-pixels SP1, SP2, and SP3 of the first region F1 and the third region F3 can be asymmetric with respect to the second region F2.

For example, each of the first angle f1 and the third angle f3 can be selected within a range of 0 to 45 degrees, but aspects are not limited thereto.

Meanwhile, the first, second, and third sub-pixels SP1, SP2, and SP3 of the second region F2 can also be formed to be inclined with respect to the second direction, thereby further preventing the driver's viewer from being obstructed. Such a configuration will be described with reference to FIG. 13.

Figure 13:
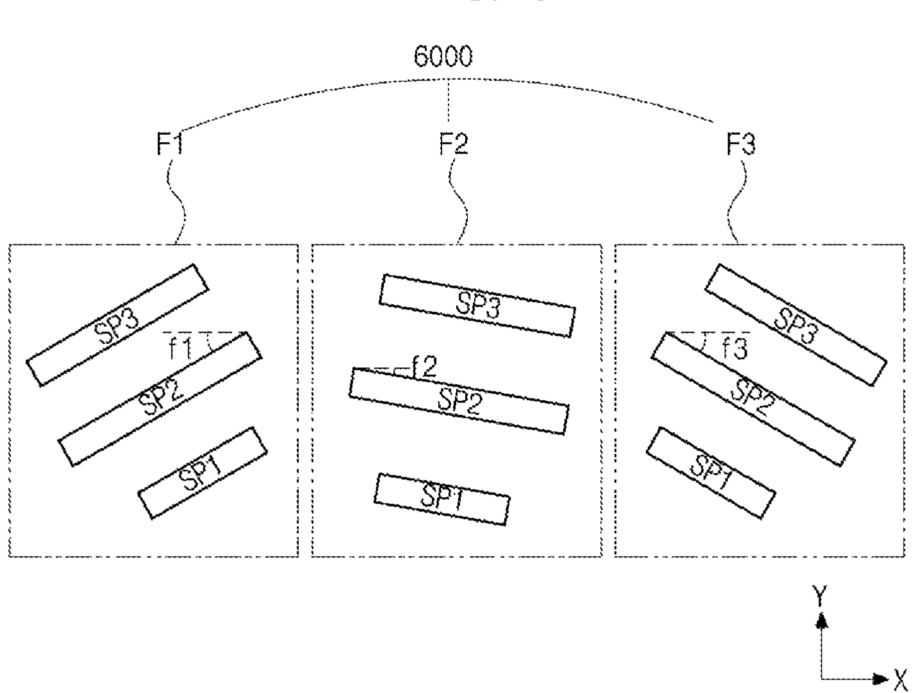
FIG. 13 is a view schematically illustrating another sub-pixel arrangement of the organic light-emitting diode display device according to the fifth aspect of the present disclosure.

FIG. 13 is a view schematically illustrating another sub-pixel arrangement of the organic light-emitting diode display device according to the fifth aspect of the present disclosure.

In FIG. 13, the first, second, and third sub-pixels SP1, SP2, and SP3 of the first region F1 can be inclined at a first angle f1 in the counterclockwise direction with respect to the second direction, the first, second, and third sub-pixels SP1, SP2, and SP3 of the second region F2 can be inclined at a second angle f2 in the clockwise direction with respect to the second direction, and the first, second, and third sub-pixels SP1, SP2, and SP3 of the third region F3 can be inclined at a third angle f3 in the clockwise direction with respect to the second direction.

Here, the second angle f2 can be smaller than or equal to the third angle f3. For example, each of the first angle f1 and the third angle f3 can be selected within a range of 0 and 45 degrees, but aspects are not limited thereto.

As described above, in the organic-light emitting diode display device according to the fifth aspect of the present disclosure, the arrangement angle of the sub-pixels SP1, SP2, and SP3 can be different for each region, thereby preventing obstruction of the view by the reflected light.

In the present disclosure, the lenses can be provided to limit the viewing angle, and the translucent overcoat layer and the color filter layer can be provided over the lens to block the reflection of the external light, so that the polarizing plate can be omitted, thereby improving the luminance and reducing the costs.

In addition, the black matrix over the lenses can have different widths, so that the viewing angle can be implemented differently for the location.

Further, the black matrix over the lenses can be configured asymmetrically with respect to the lenses, so that the viewing angle can be implemented differently for the direction.

Moreover, two black matrixes can be disposed under the lenses to maximize the size of the black matrix, so that the reflection of the external light can be further blocked.

Furthermore, the arrangement angle of the sub-pixels can be different for each region, thereby solving the problem of the obstruction of the view by the reflected light.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting diode display device, comprising:

a display panel including a first electrode, a light-emitting layer, and a second electrode provided at each of a plurality of sub-pixels;

a first black matrix disposed over the display panel;

a lens disposed over the first black matrix and corresponding to the sub-pixel;

a translucent overcoat layer disposed over the lens;

a color filter layer disposed over the translucent overcoat layer;

a second black matrix disposed between the first black matrix and the color filter layer; and a cover window disposed over the color filter layer, wherein the first black matrix has a width larger than a width of the second black matrix in a first direction, and wherein a maximum width of the lens is greater than a distance between adjacent first black matrixes and smaller than a distance between adjacent second black matrixes.

2. The organic light-emitting diode display device of claim 1, wherein the translucent overcoat layer has a transmittance of 50% to 70%.

3. The organic light-emitting diode display device of claim 1, wherein the second black matrix is disposed between the translucent overcoat layer and the color filter layer.

4. The organic light-emitting diode display device of claim 3, wherein the lens overlaps with the first black matrix and is spaced apart from the second black matrix.

5. The organic light-emitting diode display device of claim 1, wherein the second black matrix is disposed between the first black matrix and the lens.

6. The organic light-emitting diode display device of claim 5, wherein the lens overlaps with the first and second black matrixes.

7. The organic light-emitting diode display device of claim 5, further comprising a third black matrix disposed over the lens and formed of a same material as the color filter layer, wherein the lens is spaced apart from the third black matrix.

8. The organic light-emitting diode display device of claim 1, further comprising first and second regions along the first direction, wherein the second black matrix has a first width in the first region and a second width in the second region, and wherein the second width is smaller than the first width.

9. The organic light-emitting diode display device of claim 8, further comprising a third region, and the second region is disposed between the first region and the third region, wherein the second black matrix has a third width in the third region, and wherein the third width is larger than the second width.

10. The organic light-emitting diode display device of claim 1, where a distance between a first side of the lens and the second black matrix along the first direction is smaller than a distance between a second side of the lens and the second black matrix.

11. The organic light-emitting diode display device of claim 1, further comprising first, second, and third regions sequentially arranged along a second direction perpendicular to the first direction, wherein, among the plurality of sub-pixels, sub-pixels of the first, second, and third regions respectively have first, second, and third angles with respect to the second direction, and wherein a sub-pixel of the third region is inclined at the third angle in a clockwise direction with respect to the second direction.

12. The organic light-emitting diode display device of claim 11, wherein a sub-pixel of the first region is inclined at the first angle in a counterclockwise direction with respect to the second direction.

13. The organic light-emitting diode display device of claim 12, wherein a sub-pixel of the second region is inclined at the second angle in the clockwise direction with respect to the second direction, and the second angle is smaller than or equal to the third angle.

14. The organic light-emitting diode display device of claim 1, wherein a thickness of the translucent overcoat layer overlapping with the lens is thinner than a thickness of the translucent overcoat layer not overlapping with the lens, and a top surface of the translucent overcoat layer overlapping with the lens protrudes convexly above a top surface of the translucent overcoat layer not overlapping with the lens.

15. The organic light-emitting diode display device of claim 14, wherein the color filter layer includes a color filter corresponding to the each of the plurality of sub-pixels, and wherein the color filter has a protruding top surface corresponding to the top surface of the translucent overcoat layer.

16. The organic light-emitting diode display device of claim 1, wherein the plurality of sub-pixels include adjacent sub-pixels that are spaced apart in a first direction, and wherein the width of the second black matrix is configured so that an angle between an edge of the lens and a closest edge of the second black matrix, relative to a direction perpendicular to a substrate, is within 30 degrees to 60 degrees.

* * * * *